(12) United States Patent
Johnson (10) Patent No.: US 7,475,373 B2
(45) Date of Patent: Jan. 6, 2009

(54) METHOD AND APPARATUS TO VISUALLY ASSIST LEGALIZED PLACEMENT WITH NON-UNIFORM PLACEMENT RULES (75) Inventor: Christopher J. Johnson, Rochester, MN (US)

(73) Assignee: International Business Machines Corporation, Armonk, NY (US)

(*) Notice: Subject to any disclaimer, the term of this patent is extended or adjusted under 35 U.S.C. 154(b) by 294 days.

(21) Appl. No.: 11/379,411

(22) Filed: Apr. 20, 2006

(65) Prior Publication Data

US 2007/0250801 A1    Oct. 25, 2007

(51) Int. Cl.
*G06F 17/50* (2006.01)
(52) U.S. Cl. .............. 716/9; 716/1; 716/11; 716/14
(58) Field of Classification Search .............. 716/1, 716/9, 11, 14
See application file for complete search history.

(56) References Cited

U.S. PATENT DOCUMENTS 6,380,954 B1 * 4/2002 Gunther ............... 715/764

* cited by examiner

*Primary Examiner*—Thuan Do
(74) *Attorney, Agent, or Firm*—Patterson & Sheridan (57) ABSTRACT

Embodiments of the present invention provide systems, methods and articles of manufacture for displaying semiconductor components in a graphical user interface and manipulating the position of semiconductor components. Embodiments of the present invention may check the placement of components against a plurality of placement rules and determine if a component is legally placed or aligned on the semiconductor structure in the x direction, the y direction, or both the x and y directions. Embodiments of the present invention may display the properly placed and misplaced components in a graphical user interface. Furthermore, embodiments of the present invention may display the components in different colors, each color corresponding to the placement rule or rules which the current component placement violates. Furthermore, embodiments of the present invention may provide tools to aid in the repositioning of a component or components, in an effort to satisfy violated design rules.

19 Claims, 11 Drawing Sheets

FIG. 8D

METHOD AND APPARATUS TO VISUALLY ASSIST LEGALIZED PLACEMENT WITH NON-UNIFORM PLACEMENT RULES

BACKGROUND OF THE INVENTION

1. Field of the Invention

The present invention generally relates to integrated circuit design.

2. Description of the Related Art

Current computer systems typically contain many integrated circuit (IC) devices, each device being designed to perform a separate function within the system. Each device may perform a different function such as general data processing or graphics processing. Each device typically contains within it several components and sub-components, each of which are delegated some portion of the device's function. Examples of these components may consist of adders, multiplexers, and registers.

Designers of integrated circuit devices generally use hardware description languages, such as VHDL (Very High Speed Integrated Circuit Hardware Description Language), to capture the design of a device and components within a device. The designer of a component typically uses a hardware description language to create a logical model of the component. The logical model typically contains hardware design code which may be used to define an instance the component. The hardware design code for the component may be used by a compiler to compile an instance of the component. The hardware design code may also be used by a synthesis tool to synthesize an instance of the component. To synthesize an instance of the component is to translate the hardware design code into a list of Boolean logic components which make up the instance of the component (and gates, inverters, or gates, etc.).

After the hardware description language design phase is complete, another phase of the integrated circuit design process commences commonly referred to as floorplanning. Floorplanning may include basic placement of components onto the physical surface available on the semiconductor. The placement of components may be guided by several design rules. For example, the design rules may dictate component placement to achieve the desired performance, spacing, and/or power consumption of the device which the components collectively form. Examples of the types of design rules are: what metal layers different components need to attach to, where the component will attach to the power grid, if and where a component may connect to an I/O pad or pads, and the necessary spacing between components. Furthermore, rules may also dictate polysilicon pitch, transistor pitch, and other component specific dimensional limitations.

Sometimes checks of the integrated circuit design are performed against the design rules after floorplanning. The results, consisting of errors indicating misplaced components according to the design rules, are presented in text based form. Manual visual analysis of the results is typically required to determine which components violate the design rules. Furthermore, hand calculations are often required to determine new and correct placement of the misplaced components. This process is prone to errors and is time consuming.

Therefore, there exists a need for an improved technique for determining when components are violating design rules and an improved technique for correcting design rule violations.

SUMMARY OF THE INVENTION

Embodiments of the present invention generally provide methods and computer readable medium for determining when components are violating design rules and for correcting design rule violations.

One embodiment of the invention provides a method of displaying circuit components located on a semiconductor floorplan. The method generally comprising: rendering circuit component outlines on a graphical user interface (GUI) of the floorplan according to current positions; determining, based on the current positions, if the circuit components comply with semiconductor design rules in a horizontal direction and a vertical direction; and identifying, in the GUI, circuit components that do not comply with semiconductor design rules in at least one of the horizontal direction and the vertical direction.

Another embodiment of the invention provides a method of displaying and manipulating circuit components located on a semiconductor floorplan. The method generally comprising: rendering circuit component outlines on a graphical user interface (GUI) of the floorplan according to current positions; determining, based on the current positions, if the circuit components comply with semiconductor design rules in a horizontal direction and a vertical direction; identifying, in the GUI, circuit components that do not comply with semiconductor design rules in at least one of the horizontal direction and the vertical direction; receiving a user input to move the circuit components; and in response to the user input, repositioning the circuit components to a different position on the semiconductor floorplan.

Another embodiment of the invention provides a computer readable medium containing a program. The program, when executed, performs an operation for displaying and manipulating circuit components on a semiconductor floorplan, the operation generally comprising: rendering circuit component outlines on a graphical user interface (GUI) of the floorplan, according to current positions; determining, based on the current positions, if the circuit components comply with semiconductor design rules in a horizontal direction and a vertical direction; and identifying, in the GUI, circuit components that do not comply with semiconductor design rules in at least one of the horizontal and the vertical direction.

BRIEF DESCRIPTION OF THE DRAWINGS

So that the manner in which the above recited features, advantages and objects of the present invention are attained and can be understood in detail, a more particular description of the invention, briefly summarized above, may be had by reference to the embodiments thereof which are illustrated in the appended drawings.

It is to be noted, however, that the appended drawings illustrate only typical embodiments of this invention and are therefore not to be considered limiting of its scope, for the invention may admit to other equally effective embodiments.

DETAILED DESCRIPTION OF THE PREFERRED EMBODIMENTS

Embodiments of the present invention provide systems, methods, and articles of manufacture for displaying semiconductor components in a graphical user interface and manipulating the position of semiconductor components. Embodiments of the present invention may check the placement of components against a plurality of placement rules. After checking the placement of the components against placement rules, embodiments of the present invention may determine if a component is legally placed or aligned on the semiconductor structure in the x direction, the y direction, or both the x and y directions. If a component or components are not legally placed on the semiconductor structure, embodiments of the present invention may perform a plurality of actions. Embodiments of the present invention may display the misplaced components in a graphical user interface. Furthermore, embodiments of the present invention may display the components in different colors, each color corresponding to the placement rule or rules which the current component placement violates. Furthermore, embodiments of the present invention may provide tools to aid in the repositioning of a component or components, in an effort to satisfy violated design rules.

In the following, reference is made to embodiments of the invention. However, it should be understood that the invention is not limited to specific described embodiments. Instead, any combination of the following features and elements, whether related to different embodiments or not, is contemplated to implement and practice the invention. Furthermore, in various embodiments the invention provides numerous advantages over the prior art. However, although embodiments of the invention may achieve advantages over other possible solutions and/or over the prior art, whether or not a particular advantage is achieved by a given embodiment is not limiting of the invention. Thus, the following aspects, features, embodiments and advantages are merely illustrative and are not considered elements or limitations of the appended claims except where explicitly recited in a claim(s). Likewise, reference to "the invention" shall not be construed as a generalization of any inventive subject matter disclosed herein and shall not be considered to be an element or limitation of the appended claims except where explicitly recited in a claim(s).

One embodiment of the invention is implemented as a program product for use with a computer system such as, for example, the network environment 100 shown in FIG. 1 and described below. The program(s) of the program product defines functions of the embodiments (including the methods described herein) and can be contained on a variety of signal-bearing media. Illustrative signal-bearing media include, but are not limited to: (i) information permanently stored on non-writable storage media (e.g., read-only memory devices within a computer such as CD-ROM disks readable by a CD-ROM drive); (ii) alterable information stored on writable storage media (e.g., floppy disks within a diskette drive or hard-disk drive); and (iii) information conveyed to a computer by a communications medium, such as through a computer or telephone network, including wireless communications. The latter embodiment specifically includes information downloaded from the Internet and other networks. Such signal-bearing media, when carrying computer-readable instructions that direct the functions of the present invention, represent embodiments of the present invention.

In general, the routines executed to implement the embodiments of the invention, may be part of an operating system or a specific application, component, program, module, object, or sequence of instructions. The computer program of the present invention typically is comprised of a multitude of instructions that will be translated by the native computer into a machine-readable format and hence executable instructions. Also, programs are comprised of variables and data structures that either reside locally to the program or are found in memory or on storage devices. In addition, various programs described hereinafter may be identified based upon the application for which they are implemented in a specific embodiment of the invention. However, it should be appreciated that any particular program nomenclature that follows is used merely for convenience, and thus the invention should not be limited to use solely in any specific application identified and/or implied by such nomenclature.

An Exemplary System

Figure 1:
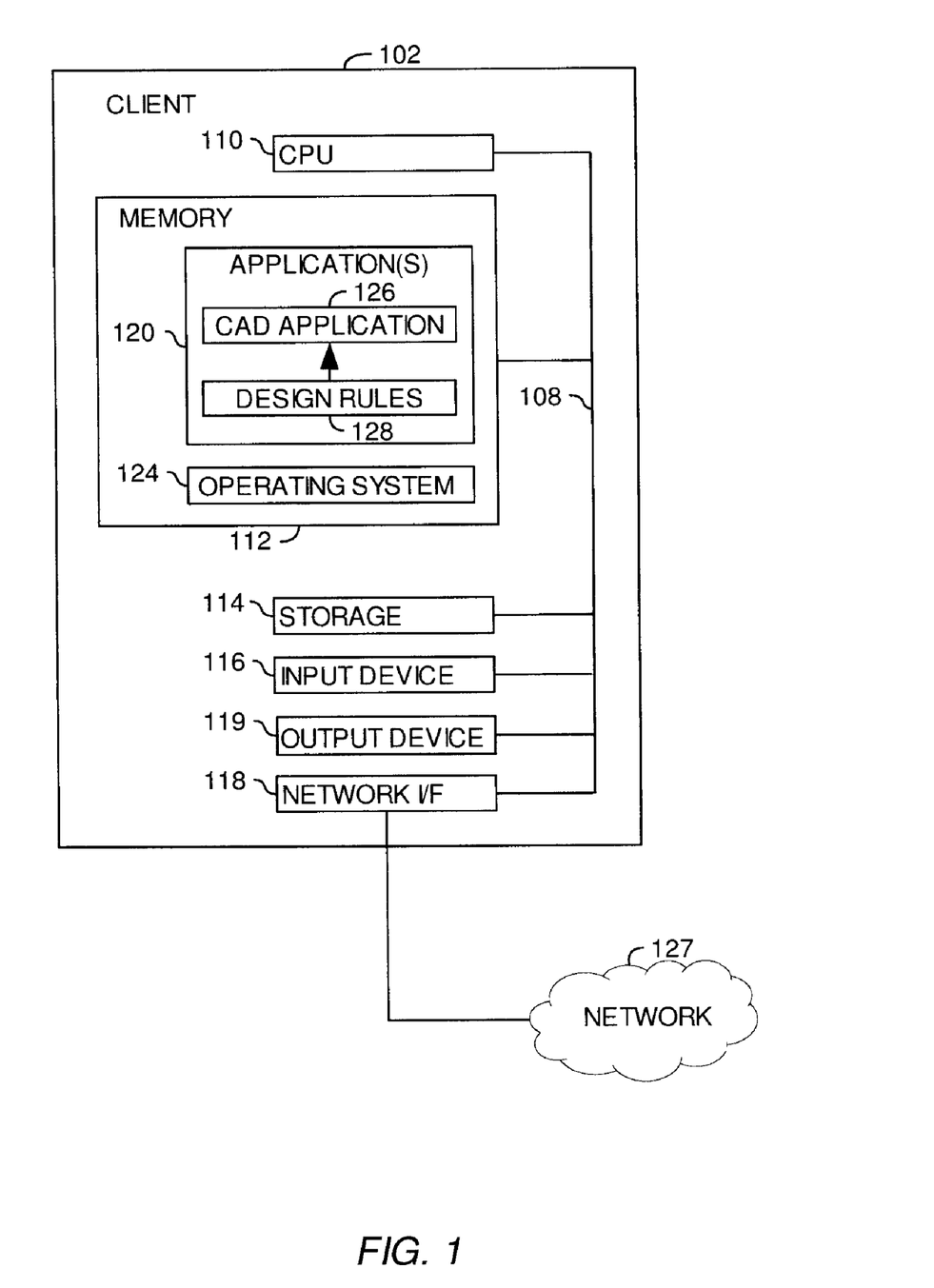
FIG. 1 is a block diagram of an exemplary computer system used to display a graphical user interface, according to one embodiment of the invention.

FIG. 1 is a block diagram of a computer system 102 used to display a graphical user interface, according to one embodiment of the invention. The computer system 102 may be connected via a network 127. In general, the network 127 may be any combination of a local area network (LAN), a wide area network (WAN), wireless network, or any other suitable type network, including the Internet.

As illustrated, the computer system 102 generally includes a Central Processing Unit (CPU) 110 connected via a bus 108 to a memory 112, storage 114, input devices 116, output devices 119, and a network interface device 118. The input devices 116 may be any devices to give input to the client computer 102, such as a mouse, keyboard, keypad, light-pen, touch-screen, track-ball, or speech recognition unit, audio/video player, and the like. The output devices 119 may be any suitable devices to give output to the user, including speakers and any of various types of display screens or monitors. Although shown separately from the input device 116, the output device 119 and input device 116 could be combined (e.g., a display screen with an integrated touch-screen).

The network interface device 118 may be any entry/exit device configured to allow network communications between the client computer 102 and other computers on the network 127. For example, the network interface device 118 may be a network adapter or other network interface card (NIC). Storage 114 is preferably a Direct Access Storage Device (DASD). Although shown as a single unit, storage 114 may be any combination of fixed and/or removable storage devices, such as fixed disc drives, floppy disc drives, tape drives, removable memory cards, or optical storage. The memory 112 and storage 114 could be part of one virtual address space spanning multiple primary and secondary storage devices.

The memory 112 is preferably a random access memory (RAM) sufficiently large to hold the necessary programming and data structures of embodiments of the invention. While the memory 112 is shown as a single entity, it should be understood that the memory 112 may in fact comprise a plurality of modules, and that the memory 112 may exist at multiple levels, from high speed registers and caches to lower speed but larger DRAM chips. Illustratively, the memory 112 contains an operating system 124. Examples of suitable operating systems, which may be used to advantage, include Linux and Microsoft's Windows®, as well as any operating systems designed for handheld devices, such as Palm OS®, Windows® CE, and the like (Linux is a trademark of Linus Torvalds in the US, other countries, or both). More generally, any operating system supporting the functions disclosed herein may be used.

An Exemplary Cad Application

The memory 112 is also shown containing at least one application 120. The application 120 may be any of a variety of applications. Some application programs 120 may be configured to display and manipulate components located on a semiconductor device, according to one embodiment of the invention. As shown in FIG. 1, Computer Aided Design (CAD) application 126 is located within memory 112. A CAD application 126 may perform a plurality of operations in relation to the design of a semiconductor device. In one embodiment of the invention, the CAD application 126 may display components which make up a semiconductor device through the use of a graphical user interface. The graphical user interface may be displayed via the output device 119 to a monitor connected to the computer system 102. In another embodiment of the invention, the CAD application 126 may also be used to manipulate the positioning of components located on the semiconductor device.

Also shown residing in memory 112 may be design rules 128. The CAD application may apply design rules 128 when displaying or manipulating components. Design rules 128 may dictate proper component placement on the semiconductor to achieve the desired performance, spacing, and/or power consumption of the semiconductor device. For example, design rules 128 may specify where a component may need to line up to make contact with the required metal layers, make contact with I/O pads, make contact with the power grid, or be properly spaced from other components for timing or noise purposes. The CAD application 126 may be used to display and manipulate the semiconductor components in the exemplary graphical user interface as shown in FIG. 2 based on the design rules 128.

Figure 2:
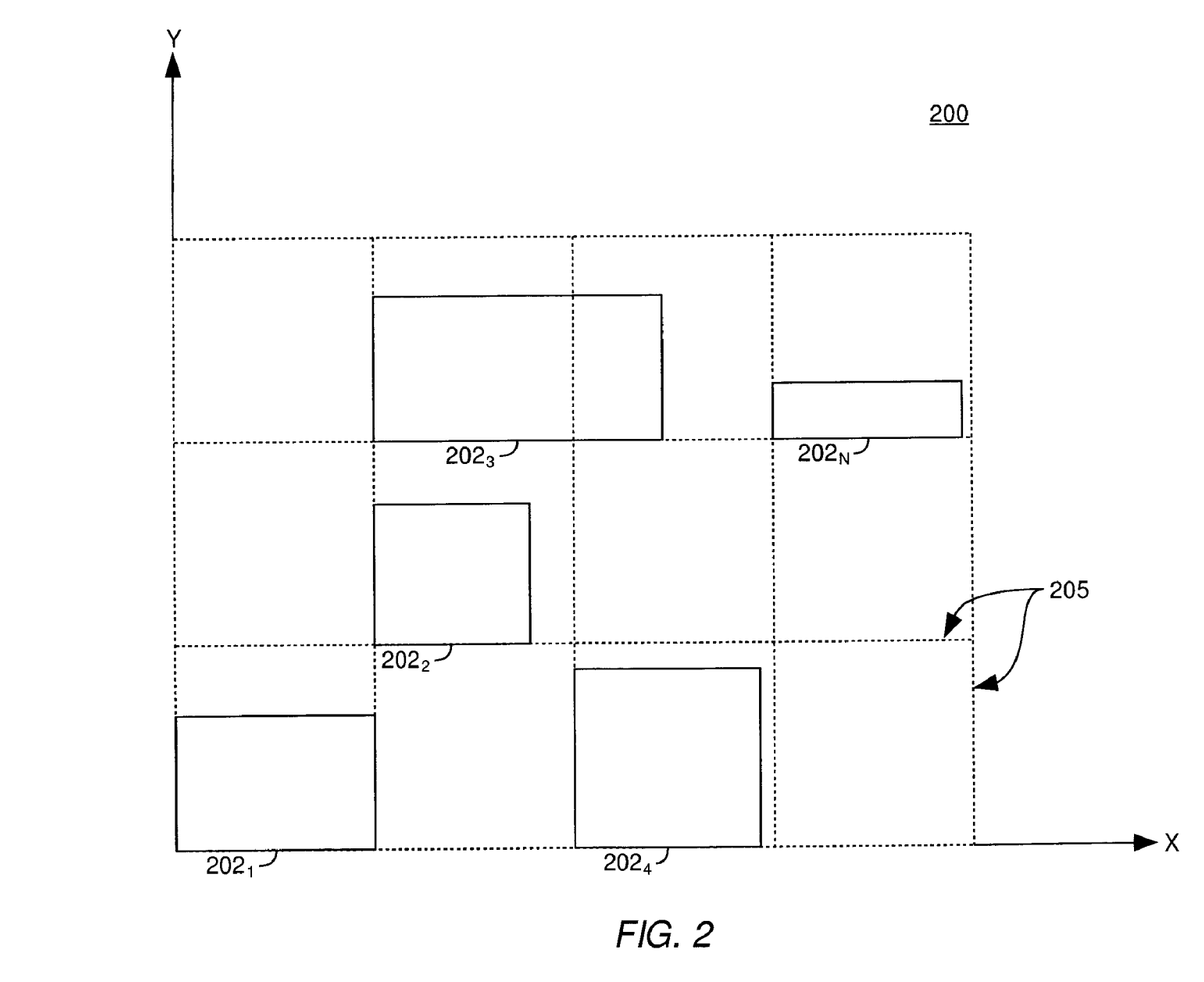
FIG. 2 is an exemplary graphical user interface used to display integrated circuit components located on a semiconductor, according to one embodiment of the invention.

FIG. 2 is an exemplary graphical user interface (GUI) 200 used to display semiconductor components ($202_1$-$202_n$) and manipulate the position of semiconductor components ($202_1$-$202_n$), according to one embodiment of the invention. The GUI 200 may show semiconductor components ($202_1$-$202_n$) in two dimensions representing the physical area of a semiconductor device which is being "floorplanned", according to one embodiment of the invention. That is, there may be an x-axis along which semiconductor components ($202_1$-$202_n$) may be positioned, and a y-axis along which the semiconductor components ($202_1$-$202_n$) may be positioned.

Although represented as single blocks, each block or semiconductor components may be a representation of a number of smaller devices. The smaller devices may consist of microscopic transistors, wires, vias, and/or connection pads. The smaller components and their interconnections construct the larger components which may be a logic device such as an adder, a multiplexer, a register or some other integrated circuit device. Each type of component may be restricted in regards to its placement on the semiconductor by design rules 128.

For example, the GUI 200 in FIG. 2 may display a grid in accordance with design rules 128. The grid is illustrated in FIG. 2 by broken horizontal and vertical lines 205. These lines 205 may illustrate where on the semiconductor components need to be in compliance with the design rules 128

During the design phase, placement of the integrated circuit components on a semiconductor may be accomplished through the use of a netlist or a database containing equivalent information. A netlist may be a list or file identifying the integrated circuit components, signals, corresponding routing traces and their desired location or position on the semiconductor. In one embodiment of the invention, the CAD application 126 may use the netlist to arrange the components which make up the semiconductor design in the GUI 200. Operations relating to generating a graphical display of components which make up the semiconductor are further described in regards to FIG. 3.

Exemplary Operations

Figure 3:
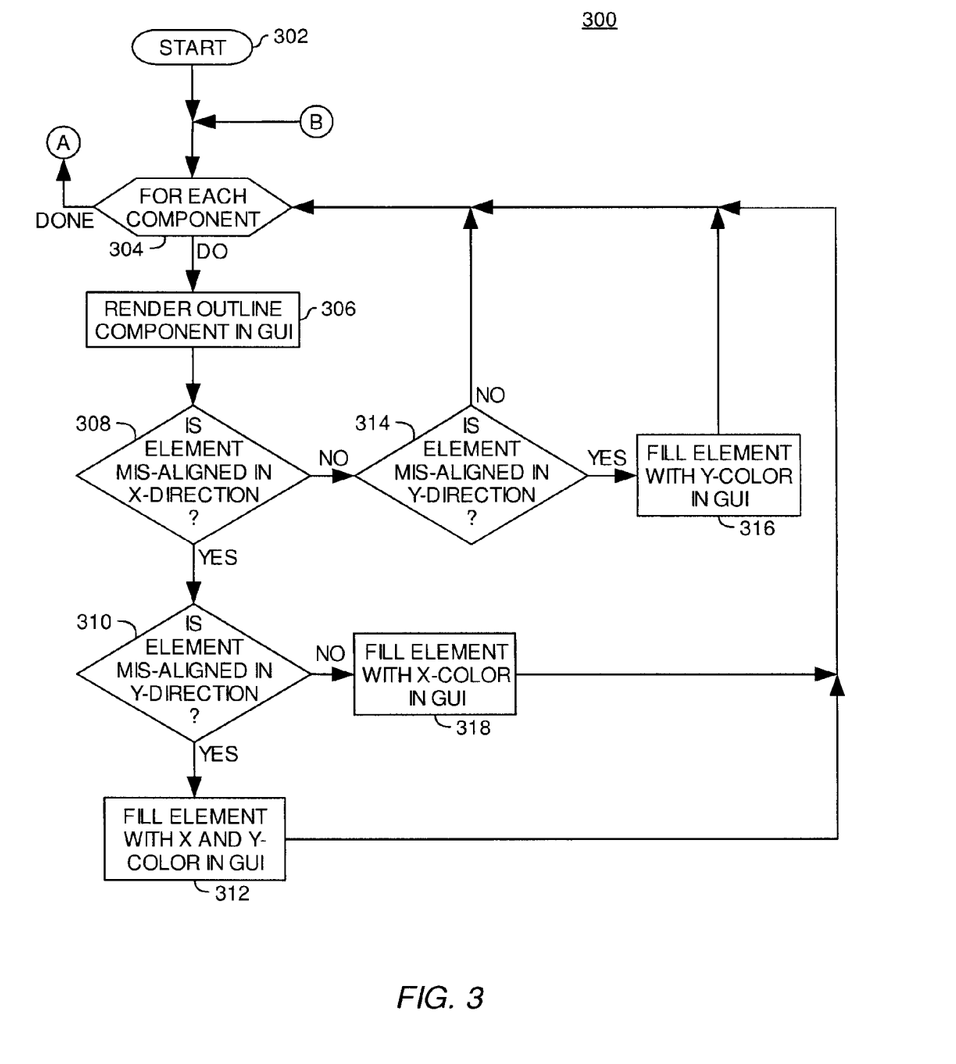
FIG. 3 is an exemplary flowchart illustrating a method of displaying integrated circuit components located on a semiconductor in a graphical user interface, according to one embodiment of the invention.

FIG. 3 is an exemplary flowchart illustrating a method 300 of displaying semiconductor components (e.g., $202_1$-$202_n$) in a GUI 200, according to one embodiment of the invention. Method 300 may begin at step 302 when the CAD application 126 is initiated. After the CAD application 126 has been initiated the CAD application 126 may begin a loop at step 304. In one embodiment of the invention, the loop 304 may repeat for each component (e.g., trace, circuit, etc.) within the netlist. In another embodiment of the invention, the loop may only repeat for each component that is in the netlist and also within the area of the semiconductor that will be displayed in the GUI 200. Next, at step 306 the CAD application 126 may render an outline of the semiconductor component in the viewable area of the GUI 200. The location of the outline of the component in the GUI 200 may be determined by checking the placement coordinates of the component in the netlist or database that contains component location information. After the outline of the component has been rendered, the CAD application 126 may proceed to step 308. At step 308, the CAD application 126 may determine if the component is misaligned along the x axis.

A component may be misaligned when its location or placement specified in the netlist violates one of the design rules 128. If the location of the component does violate a design rule with respect to its horizontal placement (i.e., along the x axis), the CAD application 126 may proceed to step 310. At step 310, the CAD application 126 may determine if the element is misaligned with respect with its vertical placement (i.e., along the y axis). If the element is misaligned vertically, the CAD application 126 may proceed to step 312. At step 312 the CAD application 126 may fill, shade or color the component with a color or shade which represents a misalignment in both the x and y direction.

Figure 4A:
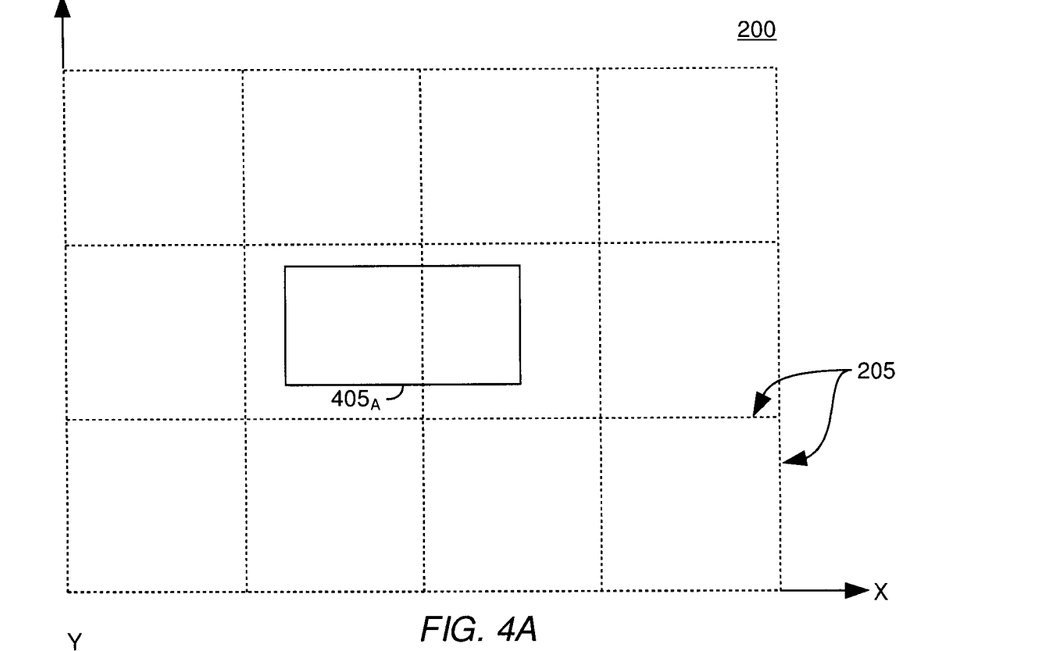
FIGS. 4A, 4B, 5A, 5B, 6A and 6B are exemplary graphical user interfaces displaying semiconductor components, according to one embodiment of the invention.
Figure 4B:
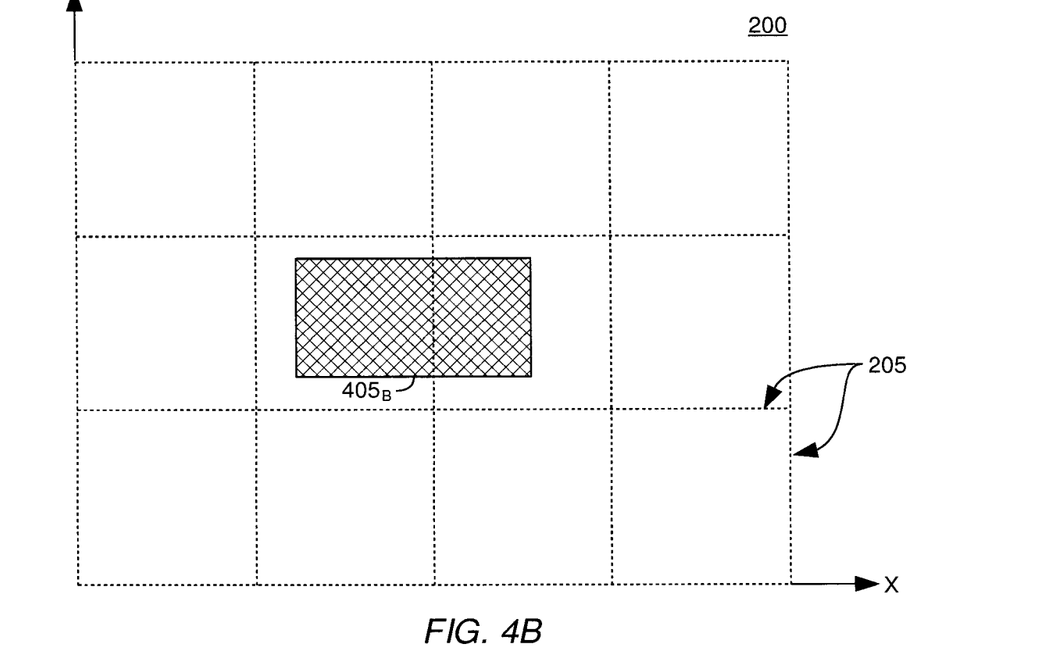

FIG. 4A is an illustration of an exemplary component 405A displayed in a GUI 200. The GUI 200 shows a grid 205 representing design rules 128. Also shown in FIG. 4A is a component 405A which is misaligned in both the x direction and the y direction (i.e., the placement of the component violates both vertical and horizontal design rules). In step 312 of method 300, the CAD application 126 may fill, shade or color the component 405A with a color corresponding to a misalignment in both the x and y directions. The colored component 405B is illustrated in FIG. 4B.

After the CAD application 126 has filled, shaded or colored the component, the CAD application 126 may return to step 304 to render the outline of another component in the GUI 200.

Returning to step 308, if the component was not misaligned in the x direction, the CAD application 126 may proceed to step 314. At step 314, the CAD application 126 may determine if the component is misaligned in the y direction. If the CAD application 126 determines that the component is not misaligned in the y direction, then the component is aligned in both the x and the y directions. In this scenario, the CAD application 126 may not fill, shade or color the component with a color. As an alternative, the CAD application 126 may color the component with a color is associated with a correct alignment in both the x and the y directions. For example, the CAD application 126 may fill, shade or color the component green. After step 314, the CAD application 126 may return to step 304 to render the outline of another component in the GUI 200.

However, if at step 314 the CAD application determines that the component is misaligned in the y direction, the CAD application 126 may proceed to step 316. At step 316, the CAD application 126 may fill, shade or color the component with a color corresponding to a misalignment in the y direction only.

Figure 5A:
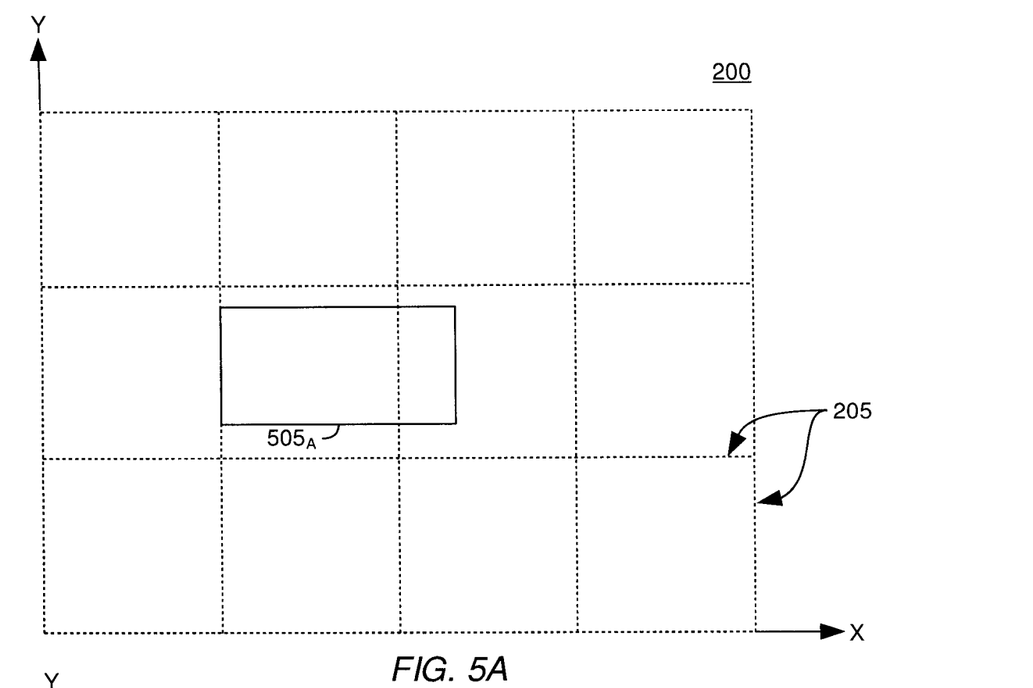
Figure 5B:
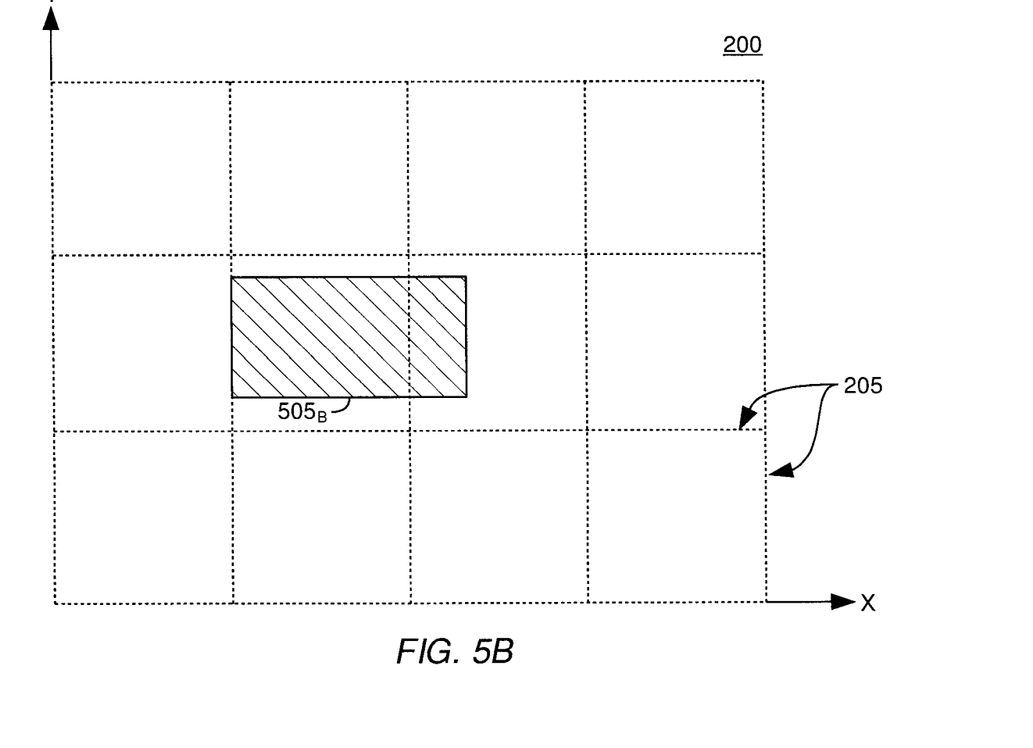

FIG. 5A is an illustration of an exemplary component displayed in a GUI 200. FIG. 5A illustrates a component 505A which is aligned in the x direction, but misaligned in the y direction. That is, the component is not aligned with any of the horizontal grid lines 205 which represent design rules. In step 316 the CAD application may fill, shade or color the component 505A with a color corresponding to a misalignment in the y direction. The colored component 505B is illustrated in FIG. 5B. After step 316, the CAD application 126 may return to step 304.

Returning to step 310, if the CAD application 126 determines that the component is not misaligned in the y direction, the CAD application 126 may proceed to step 318. At step 318, the CAD application 126 may fill the component in the GUI with a color corresponding to a misalignment in the x direction.

Figure 6A:
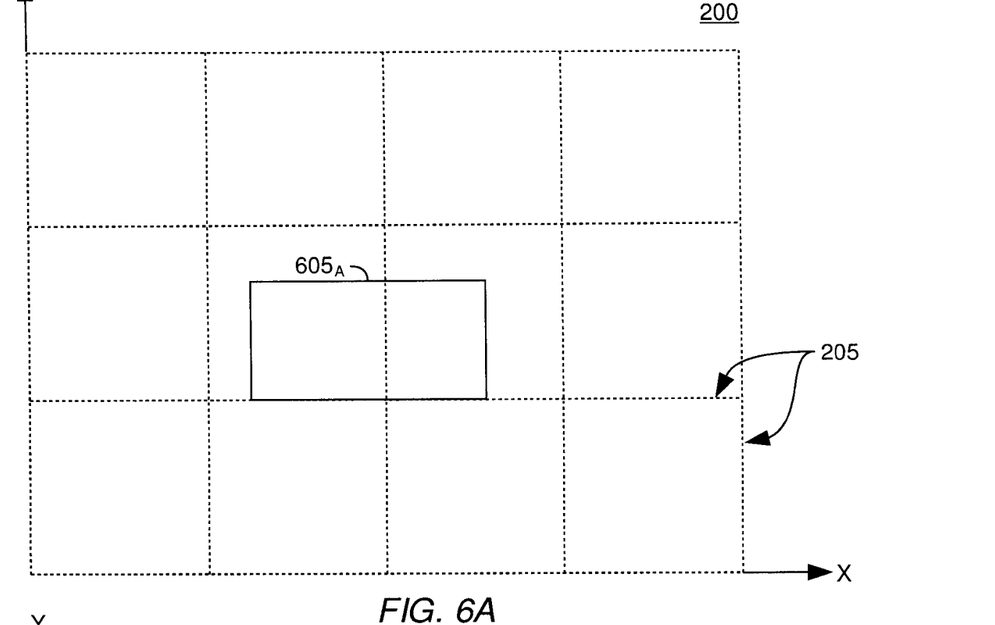
Figure 6B:
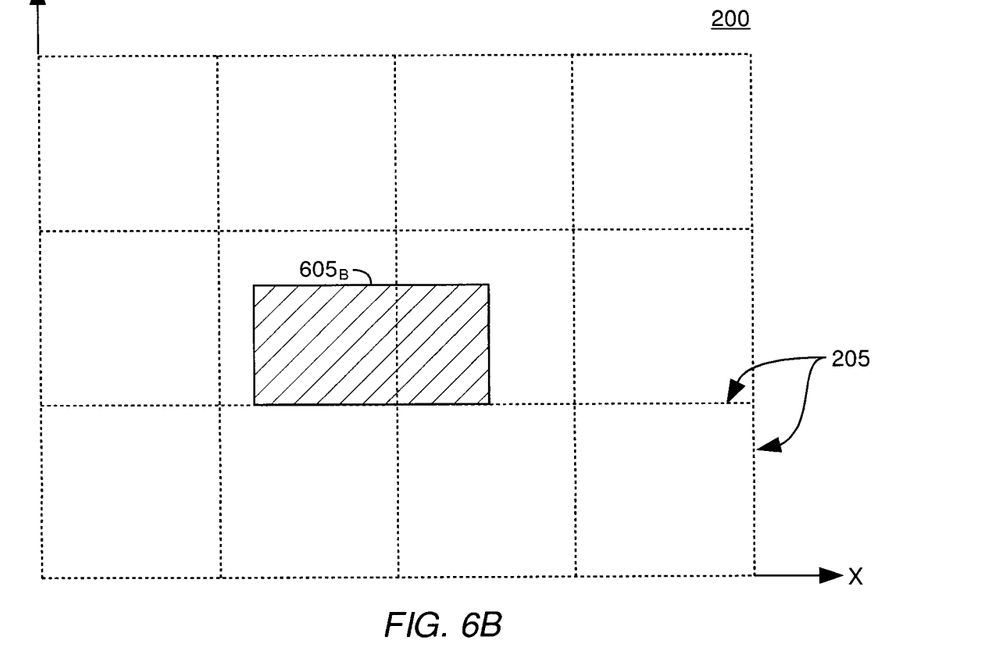

FIG. 6A is an illustration of an exemplary component 605A displayed in a GUI 200. As illustrated in FIG. 6A, the component 605A is aligned in the y-direction, but misaligned in the x direction. That is, the component 605A is not aligned with any of the vertical grid lines 205 which represent design rules 128, but the component 605A is aligned with a horizontal grid line. In step 318 of method 300, the CAD application 126 may be fill, shade or color the component 605A with a color corresponding to a misalignment in the x direction. The colored component 605B is illustrated in FIG. 6B. After step 318, the CAD application 126 may return to step 304.

Therefore, the method 300 may render each component within the viewable area of the GUI 200. Furthermore, the method 300 may color components according to misalignments in the x direction, the y direction, or both. After each component has been rendered in the GUI 200 and colored, if necessary, the loop 304 may exit. After the loop exits, the method 300 may proceed to step 730 in FIG. 7.

Figure 7:
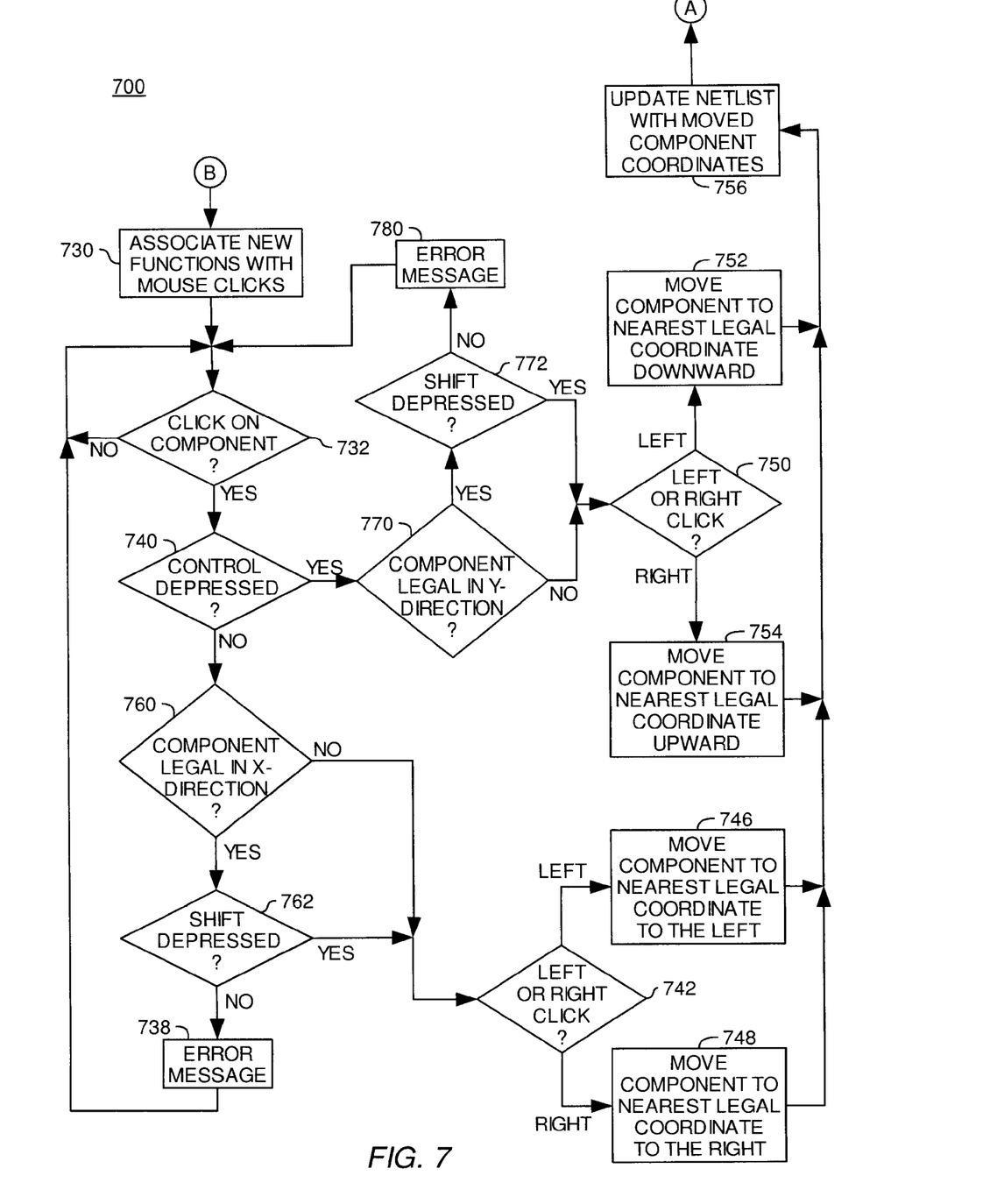
FIG. 7 is an exemplary flowchart illustrating a method moving integrated circuit component located on a semiconductor in a graphical user interface, according to one embodiment of the invention.

FIG. 7 is an exemplary flowchart illustrating a method 700 of positioning integrated circuit components within a GUI 200 generated by a CAD application 126, according to one embodiment of the invention. In one embodiment, the CAD application 126 may process user input received via an I/O device (e.g., a mouse or a keyboard) to reposition integrated circuit components within the GUI 200 in an effort to satisfy design rules indicated as violated (e.g., via the coloring scheme described above). Furthermore, the new positions of the integrated circuit components may be saved in the netlist or in a database which defines the physical location of the integrated circuit components on the semiconductor.

Automatic positioning may be facilitated by the association of a particular user action (mouse clicks, key combinations, etc.). For example, a mouse may have a left button and a right button. In a typical GUI the left button may be used to select an item and the right button may be used to bring up a menu. However, at step 730 the CAD application 126 may associate new functions with the left button and the right button of the mouse. For example, in one embodiment of the invention, when using the CAD application 126 a click of the left or right mouse button may move an object to the left or to the right horizontally along the x axis to the nearest legal (i.e., according to the design rules) position.

Furthermore, additional functionality of the left and right mouse buttons while using the CAD application 126 may be implemented by simultaneously depressing keys on a keyboard while clicking the left mouse button or the right mouse button. In one embodiment, if the control key on the keyboard is depressed while a left or right mouse button is depressed or clicked, an integrated circuit component may be moved to the nearest legal position and in a vertical direction. However, in one embodiment of the invention, if a component is already located at a legal position, clicking on the component may not move the component. However, if the shift button is depressed while a left or right mouse button is depressed or clicked, an integrated circuit component may be moved to a new legal position regardless of whether or not the integrated circuit component was already located in a legal position. This functionality is described further below.

After the CAD application 126 has associated new functions with the mouse buttons, the CAD application 126 may proceed to step 732. At step 732, the CAD application 126 may determine if a user has clicked on a component displayed in the GUI 200. If the user has not clicked on a component, the CAD application 126 may return to 732 where the CAD application 126 may continue to monitor for mouse clicks on components. If there has been mouse click on a component, the CAD application 126 may proceed to step 740.

Next, at step 740, the CAD application may determine if the control button on the keyboard was depressed when the left or right mouse button was clicked. The CAD application 126 may determine if keys on the keyboard have been or are depressed by checking I/O registers, or by using other methods known by those commonly skilled in the art. If the CAD application 126 determines that a control button was not depressed, the CAD application 126 may proceed to step 760.

At step 760, the CAD application 126 may determine if the component which was clicked on by the user is already in a legal position with respect to the x direction. If so, the CAD application 126 may proceed to step 762. At step 762, the CAD application 126 may determine if the shift button on the keyboard was depressed when the left or right mouse button was clicked. If the shift button was not depressed, the CAD application 126 may proceed to step 738.

At step 738, the user clicked on the integrated circuit component without the shift button depressed and the object was in a legal position with respect to the x direction, thus the CAD application 126 may return an error message (e.g., a pop-up window in the GUI 200, a beep, or any other suitable user alerting technique) to the user of the CAD Application 126. This error message may inform the user of the CAD Application 126 that the component is already legally placed according to the design rules and therefore may not be moved.

These steps ensure that a component in a legal position with respect to the x direction will not be moved in a lateral direction unless the user depresses the shift button as the user clicks on the component. After step 738, the CAD application may return to step 732 to monitor for a left or right mouse button click.

However, if at step 760 the CAD application 126 determined that the component was not in a legal position with respect to the x direction, the CAD application 126 may proceed to step 742. Furthermore, if at step 762 the CAD application 126 determined that the shift button was depressed, the CAD application 126 may also proceed to step 742. Steps of method 700 from step 742 on will move components in the x direction. Thus, the only way components may be moved by the CAD application 126, is either that they are not legally placed on the semiconductor in the x direction, the shift button is depressed when a user clicked on the component, or both.

At step 742, the CAD application 126 may determine if the left or right mouse button was clicked. If the left mouse button was clicked, the CAD application may proceed to step 746. At step 746, the CAD application 126 may move the component to the nearest legal x coordinate to the left. If at step 742 the CAD application 126 determines that the right mouse button was clicked, the CAD application 126 may proceed to step 748. At step 748 the CAD application 126 may move the component to the nearest legal x coordinate in the right direction.

Figure 8A:
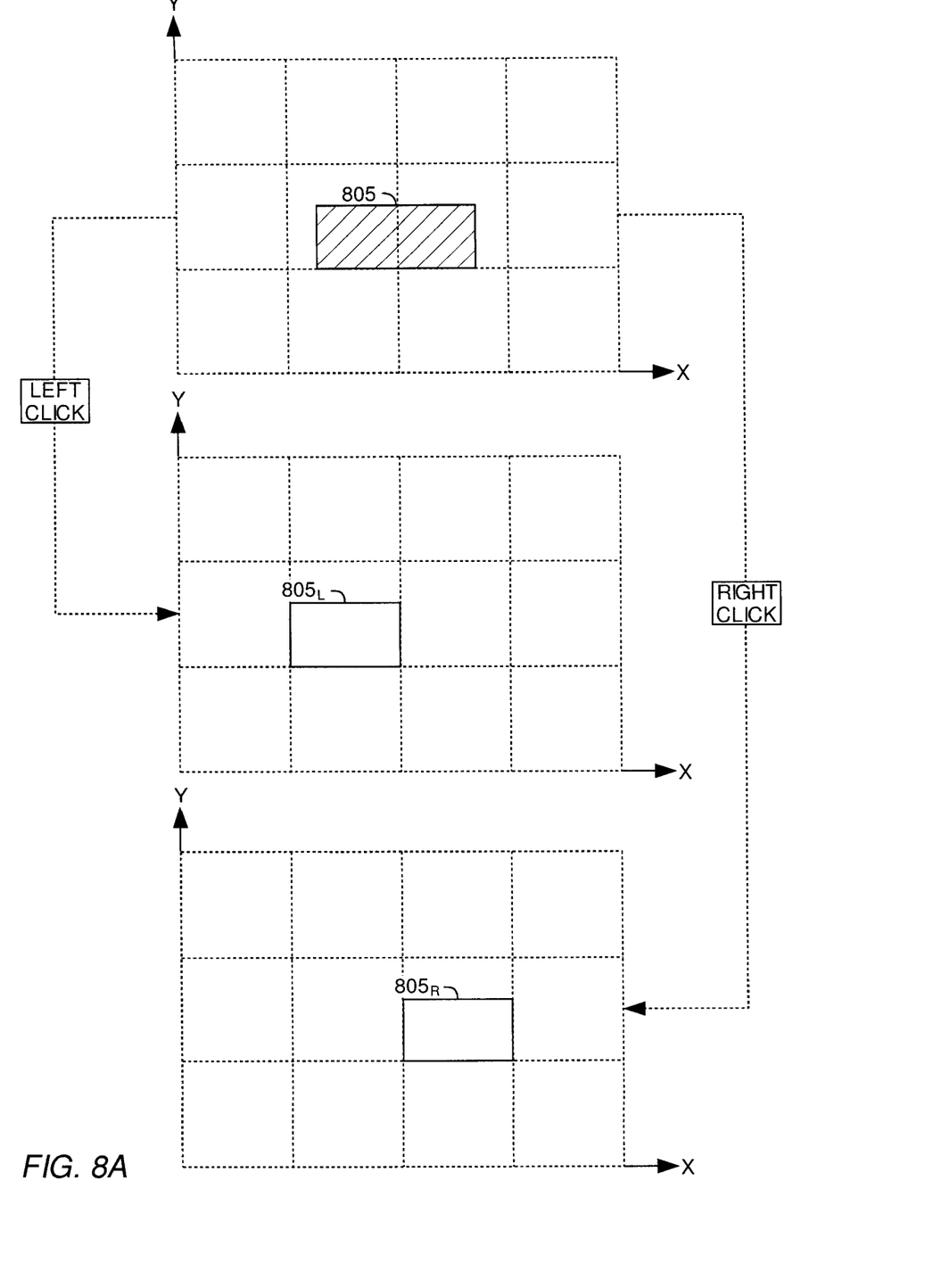
FIGS. 8A through 8D are exemplary graphical user interfaces displaying semiconductor components, according to one embodiment of the invention.

For example, the actions taken in steps 746 and 748 of moving an integrated circuit component to the nearest legal x coordinate horizontally are illustrated in FIG. 8A. In this example, the component 805 is initially misaligned along the x axis. The component 805 may have been filled, shaded, or colored a color corresponding to a misalignment in the x direction as described above in method 300. If at step 742 the CAD application 126 determines that the user has left clicked on the component 805, at step 746 the component 805 may be moved from its current position to the nearest legal x coordinate to the left (component 805L). However, if at step 742 the CAD application 126 determines that the user has right clicked on the component 805, at step 748 the component 805 may be moved from its current position to the nearest legal x coordinate to the right (component 805R).

Figure 8B:
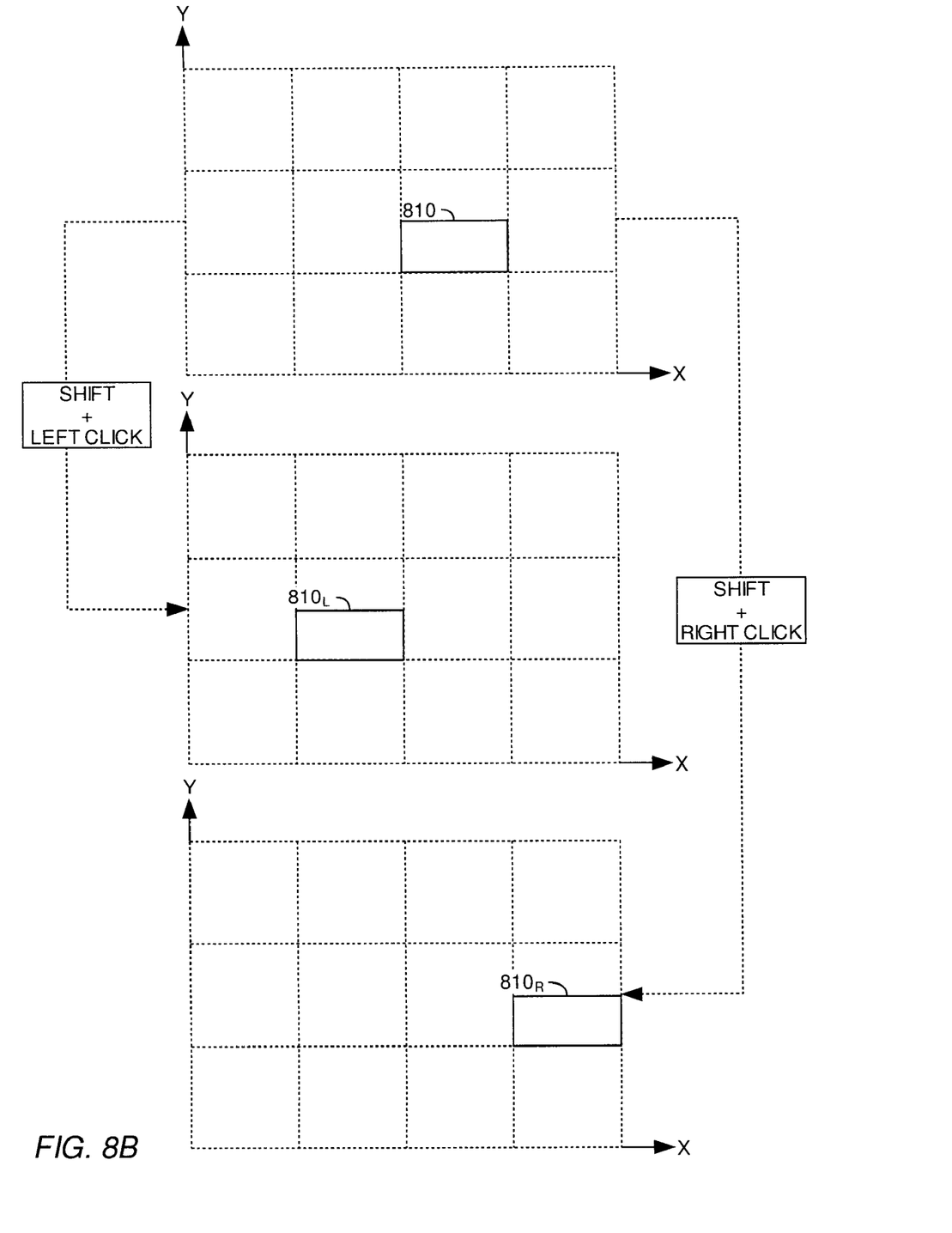

Another example of the actions taken in steps 746 and 748 of moving an integrated circuit component to the nearest legal x coordinate is illustrated in FIG. 8B. In this example the component 810 is already located in a legal location when the user clicks on the component 810. In this example the user may have the shift button depressed when the user clicked on the component 810 so that the component 810 may be moved from a currently legal position to a different legal position. If at step 742 the CAD application 126 determines that the user has left clicked on the component 810 (while the shift key is depressed), at step 746 the component 810 may be moved from its current legal position to the nearest legal x coordinate to the left (component 810L). However, if at step 742 the CAD application 126 determines that the user has right clicked on the component 810 (while the shift key is depressed), at step 748 the component 810 may be moved from its current legal position to the nearest legal x coordinate to the right (component 810R). After step 746 or step 748, the CAD application 126 may proceed to step 756.

Returning to step 740, if the CAD application 126 determined that the control button on the keyboard was depressed when the user clicked on a component, the CAD application 126 may proceed to step 770.

At step 770, the CAD application 126 may determine if the component which was clicked on by the user is already in a legal position with respect to the y direction. If so, the CAD application 126 may proceed to step 772. At step 772, the CAD application 126 may determine if the shift button on the keyboard was depressed when the left or right mouse button was clicked. If the shift button was not depressed, the CAD application 126 may proceed to step 780.

At step 780, the user clicked on the integrated circuit component without the shift button depressed and the object was in a legal position with respect to the y direction, thus the CAD application 126 may return an error message (e.g., a pop-up window in the GUI 200, a beep, or any other suitable user alerting technique) to the user of the CAD Application 126. This error message may inform the user of the CAD Application 126 that the component is already legally placed according to the design rules and therefore may not be moved. These steps ensure that a component in a legal position with respect to the y direction will not be moved in a vertical direction unless the user depresses the shift button as the user clicks on the component. After step 780, the CAD application may return to step 732 to monitor for a left or right mouse button click.

However, if at step 770 the CAD application 126 determined that the component was not in a legal position with respect to the y direction, the CAD application 126 may proceed to step 750. Furthermore, if at step 772 the CAD application 126 determined that the shift button was depressed, the CAD application 126 may also proceed to step 750. Steps of method 700 from step 750 on will move components in the y direction. Thus, the only way components may be moved by the CAD application 126 in the y direction, is either that they are not legally placed on the semiconductor in the y direction, the shift button and the control button are depressed when a user clicked on the component, or both.

In one embodiment of the invention, a component that was clicked on while the control button was depressed may be moved in the upwards or downwards direction. At step 750, the CAD application may determine if the left or right mouse button was clicked while the control button was depressed. If the left mouse button was clicked, the CAD application 126 may proceed to step 752. At step 752, the CAD Application 126 may move the clicked on component to the nearest legal y coordinate in a downward direction. However, if at step 750, the CAD application 126 determines that right mouse button was clicked the CAD application 126 may proceed to step 754. At step 754, the CAD application 126 may move the component to the nearest legal y coordinate in the upward direction.

Figure 8C:
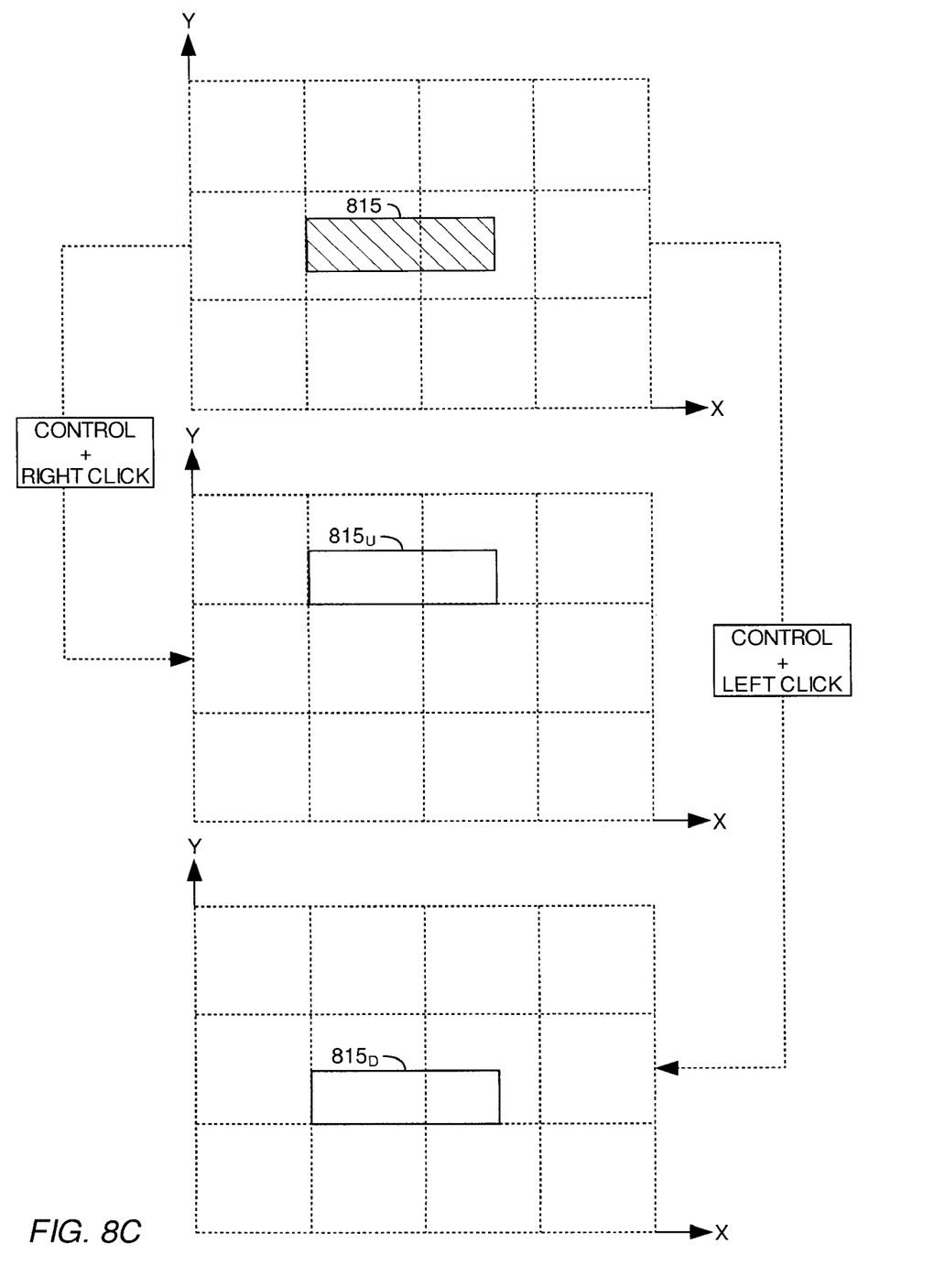

For example, the actions taken in steps 752 and 754 of moving an integrated circuit component to the nearest legal y coordinate are illustrated in FIG. 8C. As illustrated, a component may be initially misaligned in the y direction. If a component was initially misaligned in the y direction, the method 300 may have filled/colored the component with a color corresponding to a misalignment in the y direction as illustrated by the component 815 in FIG. 8C.

If, at step 750, the CAD application 126 determines that the user has right clicked on the component 815 (while the control key is depressed), at step 754 the component 815 may be moved from its current position to the nearest legal y coordinate upwards (component 815U). However, if at step 750 the CAD application 126 determines that the user has left clicked on the component 815 (while the control key is depressed), at step 752 the component 815 may be moved from its current position to the nearest legal y coordinate downwards (component 815D). After step 752 or step 754, the CAD application 126 may proceed to step 756.

Figure 8D:
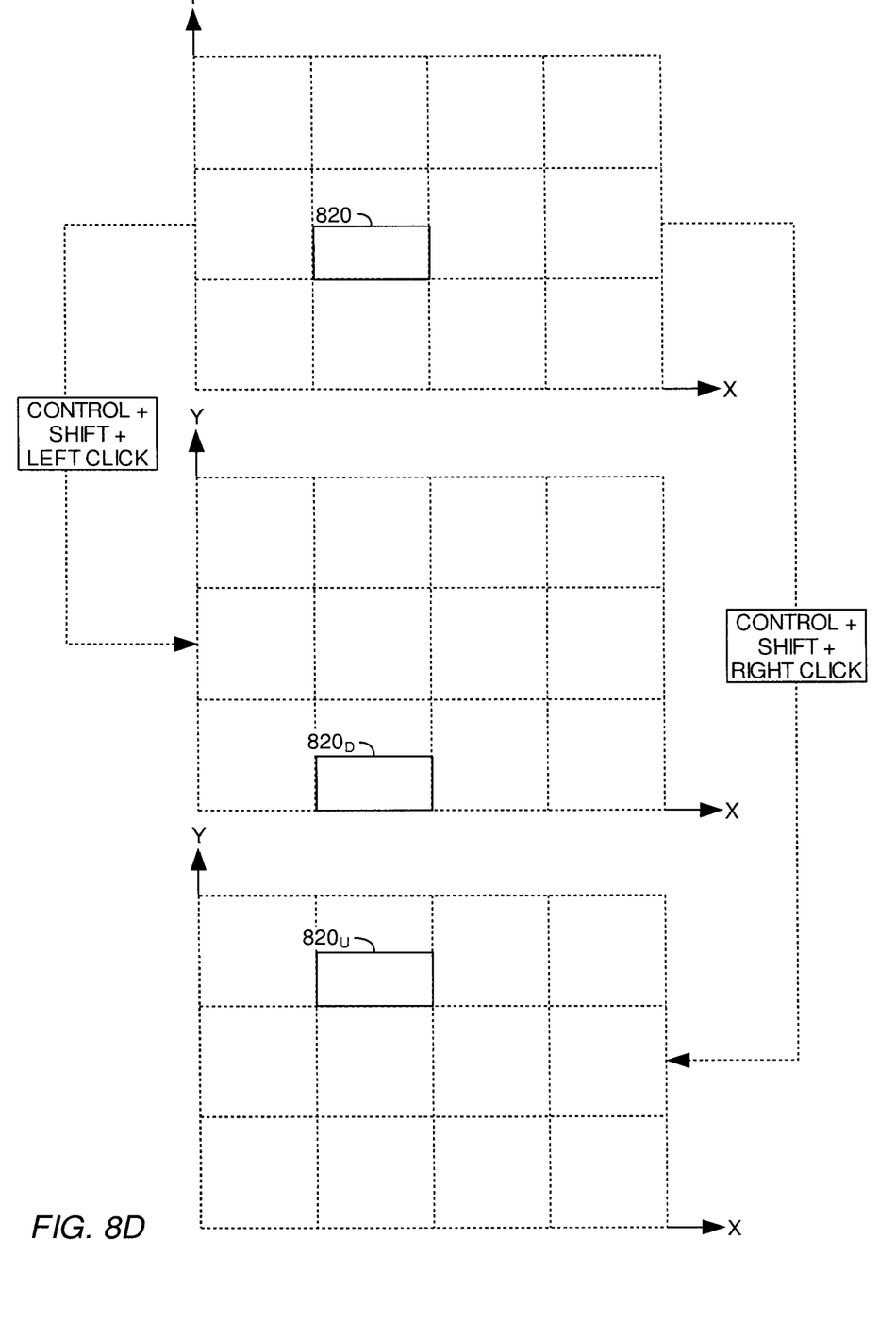

Another example of the actions taken in steps 752 and 754 of moving an integrated circuit component to the nearest legal y coordinate is illustrated in FIG. 8D. In this example the component 820 is already in a legal location/position when the user clicks on the component 820. However, the shift button is depressed when the user clicks on the component 820, the component 820 may be moved to a different legal position. If at step 750 the CAD application 126 determines that the user has left clicked on the component 820 (while the shift key and the control key are depressed), at step 752 the component 820 may be moved from its current legal position to the nearest legal y coordinate downward (component 820D). However, if at step 750 the CAD application 126 determines that the user has right clicked on the component 820 (while the shift key and the control key are depressed), at step 754 the component 820 may be moved from its current legal position to the nearest legal y coordinate upward (component 820U). After step 752 or step 754, the CAD application 126 may proceed to step 756.

At step 756, the CAD application 126 may update or save the coordinates of the components after they were moved by the CAD application 126 to the netlist or database containing component coordinates.

After step 756 the CAD application may return to method 300 to re-render the GUI with updated component positions and fill colors which reflect the changes executed in method 700.

Conclusion

Embodiments of the present invention provide a technique to display integrated circuit components in a graphical user interface according to their actual placement on a semiconductor device. Furthermore, embodiments of the present invention provide a technique of checking the placement of integrated circuit components against design rules to determine if the component abides by the design rules. If the placement of the component does not abide by the design rules, may provide techniques of moving the components based on user input to a graphical user interface. Furthermore, the present invention may allow a user to move integrated circuit components if the components abide by the design rules. The present invention may also provide a technique for saving the updated positions of the components for future use.

While the foregoing is directed to embodiments of the present invention, other and further embodiments of the invention may be devised without departing from the basic scope thereof, and the scope thereof is determined by the claims that follow.

What is claimed is:

1. A method of displaying circuit components on a graphical user interface, comprising:
rendering circuit component outlines on the graphical user interface (GUI) of a semiconductor floorplan according to current positions;
determining, based on the current positions, if the circuit components comply with predefined semiconductor design rules in a horizontal direction and a vertical direction; and
identifying, in the GUI, circuit components that do not comply with semiconductor design rules in at least one of the horizontal direction and the vertical direction; and
in the GUI, shading, filling, or coloring circuit components which do not comply with semiconductor design rules in at least one of the horizontal and the vertical direction.

2. The method of claim 1, wherein shading, filling, or coloring circuit components which do not comply with semiconductor design rules in one direction a first color.

3. The method of claim 2 wherein shading, filling, or coloring circuit components which do not comply with semiconductor design rules in the other direction a second color.

4. The method of claim 3, wherein shading, filling, or coloring circuit components which do not comply with semiconductor design rules in either direction a third color.

5. The method of claim 4, wherein shading, filling, or coloring circuit components which comply with semiconductor design rules a fourth color.

6. The method of claim 1, wherein components which comply with semiconductor design rules are not shaded, filled, or colored.

7. A method of displaying and manipulating circuit components located on a semiconductor floorplan, comprising:
rendering circuit component outlines on a graphical user interface (GUI) of the semiconductor floorplan according to current positions;
determining, based on the current positions, if the circuit components comply with predefined semiconductor design rules in a horizontal direction and a vertical direction;
identifying, in the (GUI), circuit components that do not comply with semiconductor design rules in at least one of the horizontal directions and the vertical direction;
receiving a user input to move the circuit components; and
in response to the user input, repositioning the circuit components to a different position on the semiconductor floorplan; and
in the GUI, shading, filling, or coloring circuit components which do not comply with semiconductor design rules in at least one of the horizontal and the vertical direction.

8. The method of claim 7, further comprising:
updating at least one of a table, a netlist or a database comprising circuit component information with new integrated circuit component positions.

9. The method of claim 7, further comprising:
determining if the user input to move a circuit component complies with design rules; and
if the user input to move the circuit component does not comply with design rules, preventing repositioning of the circuit component to different positions on the semiconductor unless the shift button on the keyboard is depressed when receiving user input to move the circuit component.

10. The method of claim 7, wherein repositioning circuit components to different positions on the semiconductor comprises: in response to a left mouse button click on a circuit component, repositioning the circuit component to the nearest compliant design rule position to the left; and in response to a right mouse button click on a circuit component, repositioning the circuit component to the nearest compliant design rule position to the right.

11. The method of claim 7, wherein repositioning integrated circuit components to different positions on the semiconductor comprises: in response to a left mouse button click on a circuit component while the control key on the keyboard is depressed, repositioning the circuit component to the nearest compliant design rule position in the downward direction; and in response to a right mouse button click on a circuit component while the control key on the keyboard is depressed, repositioning the circuit component to the nearest compliant design rule position in the upward direction.

12. A computer readable medium containing a program which, when executed, performs an operation for displaying and manipulating circuit components on a semiconductor floorplan, the operation comprising:

rendering circuit component outlines on a graphical user interface (GUI) of the semiconductor floorplan, according to current positions;

determining, based on the current positions, if the circuit components comply with predefined semiconductor design rules in a horizontal direction and a vertical direction; and identifying, in the GUI, circuit components that do not comply with semiconductor design rules in at least one of the horizontal and the vertical direction; and in the GUI, shading, filling, or coloring circuit components which do not comply with semiconductor design rules in at least one of the horizontal and the vertical direction.

13. The computer readable medium of claim 12, wherein the operations further comprise:

receiving a user input to move a circuit component; and in response to the user input, repositioning the circuit component to a different position on the semiconductor floorplan.

14. The computer readable medium of claim 12, wherein the operations further comprise:

in the GUI, doing at least one of: shading, filling, or coloring a circuit component that does not comply with one semiconductor design rule in at least one of the horizontal or vertical directions a first color;

in the GUI, doing at least one of: shading, filling, or coloring a circuit component that does not comply with one semiconductor design rule in the other direction a second color;

in the GUI, doing at least one of: shading, filling, or coloring a circuit component that does not comply with more than one semiconductor design rule a third color; and in the GUI, doing at least of one of: shading, filling or coloring a circuit component that does comply with the semiconductor design rules a fourth color.

15. The computer readable medium of claim 12, wherein the current positions are specified in at least one of a table, a netlist or a database.

16. The computer readable medium of claim 13, wherein the operations further comprise, updating at least one of a table, a netlist or a database comprising circuit component information with new circuit component positions.

17. The computer readable medium of claim 12, wherein the operations further comprise, determining if the user input to move a circuit component complies with design rules.

18. The computer readable medium of claim 17, wherein the operations further comprise:

if the user input to move a circuit component does not comply with design rules, preventing repositioning of the component to different positions on the semiconductor unless the shift button on the keyboard is depressed when receiving user input to move the circuit component.

19. The computer readable medium of claim 18, wherein repositioning circuit components to different positions on the semiconductor comprises:

in response to a left mouse button click on a circuit component, repositioning the component to the nearest compliant design rule position to the left;

in response to a right mouse button click on a circuit component, repositioning the circuit component to the nearest compliant design rule position to the right;

in response to a left mouse button click on a circuit component while the control key on the keyboard is depressed, repositioning the circuit component to the nearest compliant design rule position in the downward direction; and in response to a right mouse button click on a circuit component while the control key on the keyboard is depressed, repositioning the circuit component to the nearest compliant design rule position in the upward direction.

* * * * *